(12) United States Patent
Tran et al.

(10) Patent No.: US 9,728,233 B2
(45) Date of Patent: Aug. 8, 2017

(54) SERIAL MAGNETIC LOGIC UNIT ARCHITECTURE

(71) Applicant: Crocus Technology Inc., Santa Clara, CA (US)

(72) Inventors: Thao Tran, Fremont, CA (US); Douglas Lee, San Jose, CA (US); Bertrand Cambou, Palo Alto, CA (US)

(73) Assignee: Crocus Technology Inc., Santa Clara, CA (US)

(*) Notice: Subject to any disclaimer, the term of this patent is extended or adjusted under 35 U.S.C. 154(b) by 34 days.

(21) Appl. No.: 14/732,561

(22) Filed: Jun. 5, 2015

(65) Prior Publication Data

US 2015/0357006 A1 Dec. 10, 2015

Related U.S. Application Data

(60) Provisional application No. 62/008,769, filed on Jun. 6, 2014.

(51) Int. Cl.
| | | |
|---|---|---|
| *G11C 7/10* | (2006.01) | |
| *G11C 7/00* | (2006.01) | |
| *G06F 3/06* | (2006.01) | |
| *G06F 13/38* | (2006.01) | |

(52) U.S. Cl.
CPC ............ *G11C 7/00* (2013.01); *G06F 3/061* (2013.01); *G06F 3/0659* (2013.01); *G06F 3/0673* (2013.01); *G06F 13/38* (2013.01)

(58) Field of Classification Search
CPC ...... G06F 3/061; G06F 3/0655; G06F 3/0656; G06F 3/0659; G06F 3/0673; G06F 3/0679; G06F 2003/0698; G06F 2212/2024; G11C 7/00; G11C 7/10; G11C 7/1018; G11C 7/103; G11C 7/1063; G11C 7/109
USPC ................... 365/89, 189.05; 711/103, 109
See application file for complete search history.

(56) References Cited

U.S. PATENT DOCUMENTS

| | | | | |
|---|---|---|---|---|
| 3,356,993 A | * | 12/1967 | Sharp .................. | G06F 3/09 711/107 |
| 6,754,207 B1 | * | 6/2004 | Hesse ................. | H04L 12/2854 370/388 |
| 2008/0297349 A1 | | 12/2008 | Leone | |
| 2010/0302832 A1 | | 12/2010 | Berger et al. | |
| 2013/0132798 A1 | | 5/2013 | Jeon et al. | |

OTHER PUBLICATIONS

International Search Report and Written Opinion issued to International Patent Application No. PCT/US15/34065, Aug. 25, 2015, 8 pgs.

* cited by examiner

*Primary Examiner* — Gary Portka
(74) *Attorney, Agent, or Firm* — Cooley LLP

(57) ABSTRACT

An apparatus has magnetic logic units a logic circuit configured to receive a serial input bit stream at an input node. Individual bits of data from the serial input bit stream are serially written into individual magnetic logic units without buffering the serial input bit stream between the input node and the individual magnetic logic units. Individual bits of data from individual magnetic logic units are serially read to produce a serial output bit stream on an output node without buffering the serial output bit stream between the individual magnetic logic units and the output node.

9 Claims, 3 Drawing Sheets

SERIAL MAGNETIC LOGIC UNIT ARCHITECTURE

CROSS REFERENCE TO RELATED APPLICATIONS

This application claims priority to U.S. Provisional Patent Application Ser. No. 62/008,769, filed Jun. 6, 2014, the contents of which are incorporated herein by reference.

FIELD OF THE INVENTION

This invention relates generally to digital memories. More particularly, this invention relates to a serial magnetic logic unit architecture.

BACKGROUND OF THE INVENTION

Serial interfaces receive serial bit streams. The serial bit streams are commonly loaded into address buffers and data latches so that they can be written in parallel into memory as individual bytes. The memory typically stores the individual bytes in a two dimensional memory array, which requires decoding in each of the two dimensions for both write and read operations.

It would be desirable to develop a new architecture to process serial bit streams without the overhead associated with address buffers, data latches and two dimensional decoders.

SUMMARY OF THE INVENTION

An apparatus has magnetic logic units a logic circuit configured to receive a serial input bit stream at an input node. Individual bits of data from the serial input bit stream are serially written into individual magnetic logic units without buffering the serial input bit stream between the input node and the individual magnetic logic units. Individual bits of data from individual magnetic logic units are serially read to produce a serial output bit stream on an output node without buffering the serial output bit stream between the individual magnetic logic units and the output node.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
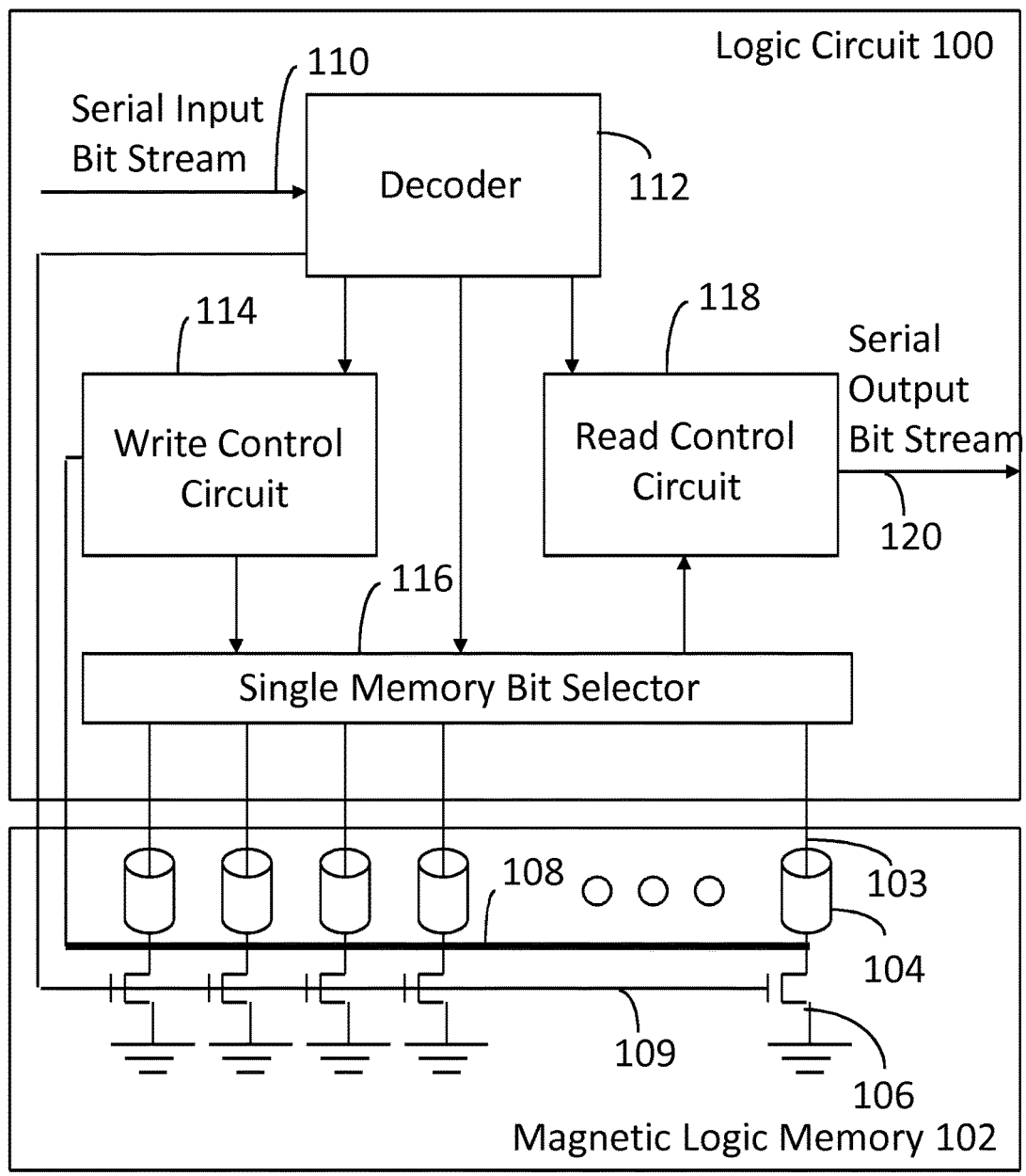
FIG. 1 illustrates a serial magnetic logic unit architecture configured in accordance with an embodiment of the invention.

FIG. 1 illustrates a logic circuit 100 and associated magnetic logic memory 102. The logic circuit 100 and magnetic logic memory 102 may be formed on a single chip or discrete chips. The magnetic logic memory 102 includes bit lines 103 connected to magnetic logic units 104, which persistently store a written magnetic state. Each magnetic logic unit 104 has an associated transistor 106, controlled by a word line 109. The word line 109 is common to all of the magnetic logic units 104 and is controlled by decoder 112. FIG. 1 also illustrates a field line 108 controlled by write control circuit 114.

Figure 2:
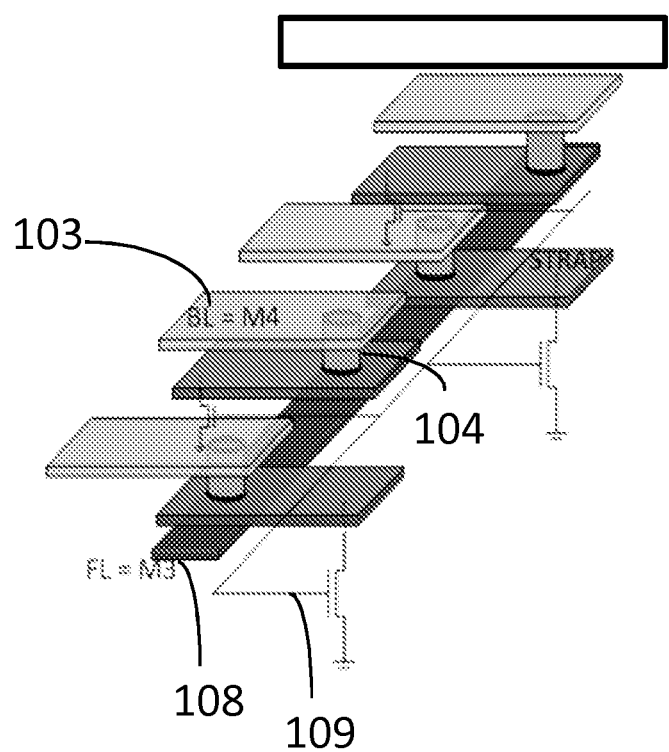
FIG. 2 illustrates a magnetic logic unit configured in accordance with an embodiment of the invention.

FIG. 2 is a three-dimensional representation of the magnetic logic units 104, the field line 108, word line 109 and individual bit lines 103. Each magnetic logic unit 104 has a sense layer and a storage layer formed of a magnetic material, such as a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer and the storage layer can include the same ferromagnetic material or different ferromagnetic materials.

The sense layer can include a soft ferromagnetic material, namely one having a relatively low coercivity, while the storage layer can include a hard ferromagnetic material, namely one having a relatively high coercivity. In such manner, a magnetization of the sense layer can be readily varied under low-intensity magnetic fields generated in response to an input signal, while a magnetization of the storage layer remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni and Fe; $Co_{90}Fe_{10}$; and alloys based on Co, Fe, and Boron (B); $Co_xFe_yB_z$. In some instances, alloys based on Ni and Fe (and optionally B) can have a smaller coercivity than alloys based on Co and Fe (and optionally B). A thickness of each of the sense layer and the storage layer can be in the nm range, such as from about 1 nm to about 20 nm or from about 1 nm to about 10 nm. Other implementations of the sense layer and the storage layer are contemplated. For example, either, or both, of the sense layer and the storage layer can include multiple sub-layers in a fashion similar to that of the so-called synthetic antiferromagnetic layer.

A magnetic field sensing element may include the storage layer and a reference layer instead of the sense layer, with the layer disposed between the storage layer and a reference layer. Each of the reference layer and the storage layer includes, or is formed of, a magnetic material and, in particular, a magnetic material of the ferromagnetic type, the characteristics of which have been described. In general, the reference layer and the storage layer can include the same ferromagnetic material or different ferromagnetic materials. The reference layer is different from the sense layer in that the reference layer typically has a high coercivity, such as a coercivity higher than the storage layer.

A tunnel barrier layer is formed of an insulating material. Suitable insulating materials include oxides, such as aluminum oxide (e.g., $Al_2O_3$) and magnesium oxide (e.g., MgO). A thickness of the tunnel barrier layer can be in the nm range, such as from about 1 nm to about 10 nm.

A magnetic field sensing element includes a pinning layer, which is disposed adjacent to the storage layer and, through exchange bias, stabilizes the storage magnetization along a particular one of the pair of directions when a temperature within, or in the vicinity of, the pinning layer is lower than a temperature $T_{BS}$. The temperature $T_{BS}$ can correspond to a blocking temperature, a Neel temperature, or another threshold temperature. The pinning layer unpins, or decouples, the storage magnetization direction when the temperature is at, or above, the blocking temperature $T_{BS}$, thereby allowing the storage magnetization direction to be switchable to another one of the pair of directions.

In one embodiment, the pinning layer is omitted adjacent to the sense layer and, as a result, the sense layer has a sense magnetization direction that is unpinned and is readily varied, with the substantial absence of exchange bias.

In another embodiment, as previously described, the magnetic field sensing element includes a reference layer instead of the sense layer. In this embodiment, an additional pinning layer may be disposed adjacent to the reference layer. This additional pinning layer may be characterized by a threshold temperature $T_{BR}$, with $T_{BR}>T_{BS}$. The temperature $T_{BR}$ can correspond to a blocking temperature, a Neel temperature, or another threshold temperature. Through exchange bias, this additional pinning layer stabilizes the reference magnetization along a substantially fixed direction at temperatures lower than the threshold temperature $T_{BR}$.

The pinning layer (and the additional pinning layer disposed adjacent to the reference layer in the alternative embodiment) includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., such as about 200° C., and can be smaller than the blocking temperature $T_{BS}$ of alloys based on Pt and Mn (or based on Ni and Mn), which can be in the range of about 300° C. to about 350° C.

Thermally assisted switching (TAS) technology, as applied to magnetic field sensing elements, provides one way of implementing a device with a resistance that varies in response to the external magnetic field around an operating point configured by the input signal for use in magnetic field sensors.

In one embodiment, the input signal to an input terminal of the magnetic field sensing array 102 may flow through one or more field lines 108 such that a magnetic field generated by the input signal is coupled to each of the magnetic field sensing elements. Alternatively or in addition, another input signal to the input terminal of the magnetic field sensing array may flow in the opposite direction through the one or more field lines 108 such that a magnetic field generated by the another input signal is also coupled to each of the magnetic field sensing elements. In one embodiment, the field line 108 may be positioned about 50 nm underneath a strap.

When the input signal is zero (e.g., zero input current assuming that the input signal to the input terminal is the only input to the magnetic field sensing array), the sense magnetization and the storage magnetization of each of the magnetic field sensing elements 104 included in the magnetic field sensing array 102 are naturally substantially anti-aligned (e.g., substantially antiparallel), resulting in a series resistance of, for example, 2 KΩ per magnetic field sensing element 104 included in the magnetic field sensing array 102. When the input signal is sufficiently small (e.g., less than a value in the range from about 2 mA to about 2.25 mA per field line 108), the sense magnetization and the storage magnetization of each of the magnetic field sensing elements 104 included in the magnetic field sensing array 102 remain substantially antiparallel, resulting in a series resistance of about 2 KΩ per magnetic field sensing element 104. When the input signal is sufficiently large (greater than a value in the range from about 2.75 mA to about 3 mA per field line 108), the sense magnetization becomes substantially aligned (e.g., substantially parallel) with the storage magnetization, resulting in a series resistance of, for example, about 1 KΩ per magnetic field sensing element 104 included in the magnetic field sensing array 102. It is contemplated that these resistance values, and in particular the ratio between these resistance values, may be varied for other embodiments of the magnetic field sensing elements 104 based on forming the sense layer, the storage layer, and/or the layer from different choices of materials, material concentrations, and/or material thicknesses.

Returning to FIG. 1, the logic circuit 100 receives a serial input bit stream on an input node 110. A decoder 112 processes the serial input bit stream and generates control signals that are applied to a write control circuit 114. The serial input bit stream 110 may include address information, data for storage and a clock signal. The write control circuit 114 writes individual bits of data from the serial input bit stream serially into individual magnetic logic units 104 without buffering the serial input bit stream between the input node 110 and the individual magnetic logic units 104. More particularly, the write control circuit 114 controls field line 108 and applies select signals to a single memory bit selector 116, which sequentially writes bits to individual magnetic logic units 104. Individual data bits are written in accordance with the address information. For example, the decoder 112 uses the address to select a bit line 103. The write control circuit 114 sources a current to the selected bit line to heat up the selected cell 104. Simultaneously, the field line 108 current is running below the selected cell 104 in a direction depending on the desired data state to flip the bit or not depending on the desired data state. The single memory bit selector 116 may be a combination multiplexer and demultiplexer, with the multiplexer writing bits and the demultiplexer reading bits.

The decoder 112 receives a control signal and coordinates the reading of the magnetic logic memory 102. In particular, the decoder applies control signals to the read control circuit 118, which produces select signals for the single memory bit selector 116. The single memory bit selector reads individual bits of data from individual magnetic logic units 104 serially to produce a serial output bit stream on output node 120 without buffering the serial output bit stream between the individual magnetic logic units 104 and the output node 120. The single memory bit selector 116 selects a bit line 103. The read control circuit 118 includes a sense-amp to sense the resistance of the cell 104 corresponding to the selected bit line 103. The sense-amp produces a digital high or digital low single bit signal, which is applied to the output node 120. The decoder 112 then selects the next bit line for sensing.

Those skilled in the art will appreciate that the disclosed single block magnetic logic memory 102 architecture eliminates the need for two axis decoding. The architecture provides for true serial high speed write and read operations without a parallel-to-serial conversion cache, multiple sense amps, serial-to-parallel or parallel-to-serial shift registers.

Programming the magnetic logic memory 102 may be performed in about 50 ns per bit compared to 10 microseconds to 1 milli-second or more for serial Flash memory and EEPROM. Read time is about 40 ns per bit. In addition, serial flash requires an erase before programming and updates require data caching. In contrast, the disclosed architecture can directly write single random bits without erasing, altering or caching other bits. Thus, the invention provides less overhead logic than serial Flash memory and EEPROM. Consequently, there is lower power leakage. The write and read operations of the magnetic logic memory are low voltage. Therefore, there is no need for high voltage transistors or the generation and regulation of high voltage signals. Test costs are lower because high voltage testing is not required. Such testing is typically required for Flash memory and EEPROM. Furthermore, no external bakes are required during production and simple logic testers may be utilized.

Figure 3:
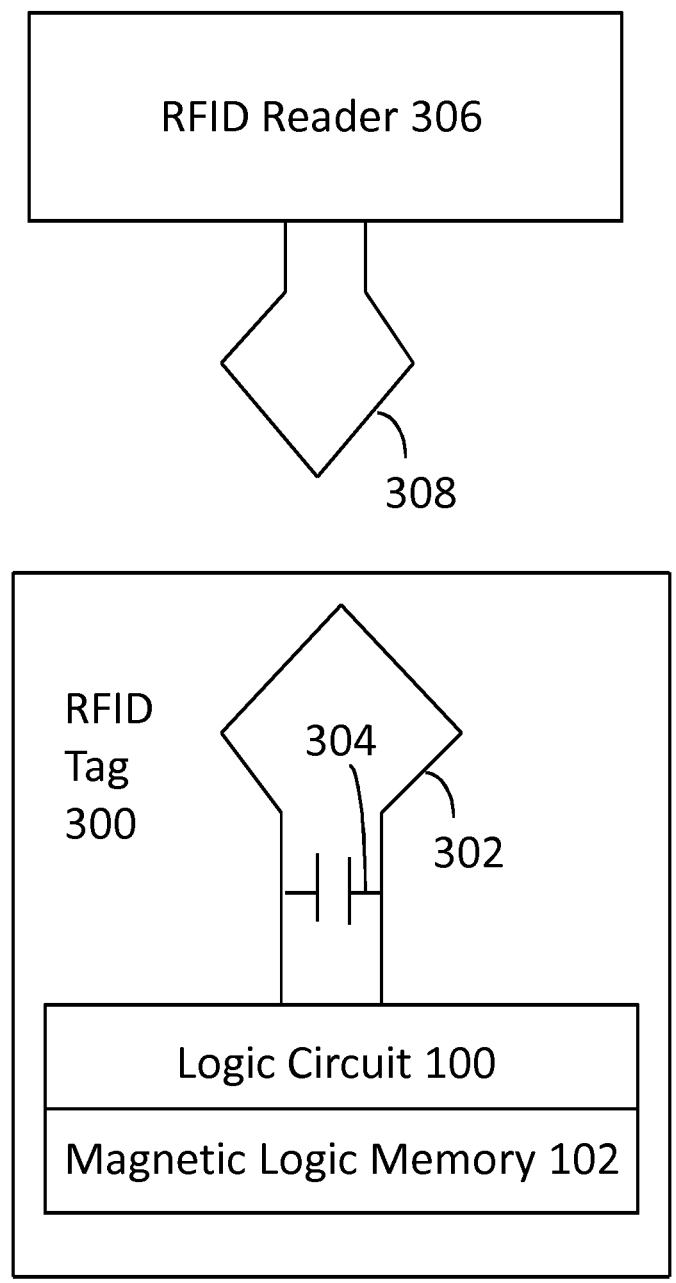
FIG. 3 illustrates an RFID tag configured in accordance with an embodiment of the invention.

The disclosed serial magnetic logic unit architecture may be used in any number of configurations. FIG. 3 illustrates a Radio Frequency Identification (RFID) Tag 300 configured in accordance with an embodiment of the invention. FIG. 3 illustrates the logic circuit 100 and magnetic logic memory 102 attached to an antenna 302. A capacitor 304 is formed between nodes of the antenna. The antenna 302 receives a magnetic signal that induces a current. The capacitor 304 receives the current and stores a charge. The logic circuit 100 is powered by the capacitor 304. The magnetic signal may be generated by an RFID reader 306 with an associated antenna 308. The RFID reader 306 may be used to apply the serial input bit stream and to process the serial output bit stream.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
 magnetic logic units with a common word line; and
 a logic circuit configured to:
  receive a serial input bit stream at an input node,
  write individual bits of data from the serial input bit stream serially into individual magnetic logic units without buffering the serial input bit stream between the input node and the individual magnetic logic units while the common word line is active, and
  read individual bits of data from individual magnetic logic units serially to produce a serial output bit stream on an output node without buffering the serial output bit stream between the individual magnetic logic units and the output node while the common word line is active.

2. The apparatus of claim 1 wherein the logic circuit includes:
 a decoder,
 a single memory bit selector,
 a write control circuit, and
 a read control circuit, wherein the decoder is configured to:
  receive the serial input bit stream from the input node and produce first control signals for the single memory bit selector to coordinate the write of individual bits of data from the serial bit input stream serially into individual magnetic logic units while the common word line is active, and
  produce second control signals for the single memory bit selector to coordinate the read of individual bits of data from individual magnetic logic units serially while the common word line is active.

3. The apparatus of claim 2 wherein the magnetic logic units share a field line and each magnetic logic unit has a bit line connection to a port of the single memory bit selector.

4. The apparatus of claim 3 wherein the field line is connected to the write control circuit.

5. The apparatus of claim 1 further comprising:
 an antenna to receive a magnetic signal that induces a current; and
 a capacitor to receive the current and store a charge, wherein the logic circuit is powered by the capacitor.

6. The apparatus of claim 5 wherein the input node is connected to the antenna to receive the serial input bit stream.

7. The apparatus of claim 5 wherein the output node is connected to the antenna to transmit the serial output bit stream.

8. An apparatus, comprising:
 magnetic logic units with a common word line; and
 a logic circuit configured to:
  receive a serial input bit stream at an input node, and
  write individual bits of data from the serial input bit stream serially into individual magnetic logic units without buffering the serial input bit stream between the input node and the individual magnetic logic units while the common word line is active.

9. An apparatus, comprising:
 magnetic logic units with a common word line; and
 a logic circuit configured to:
  read individual bits of data from individual magnetic logic units serially to produce a serial output bit stream on an output node without buffering the serial output bit stream between the individual magnetic logic units and the output node while the common word line is active.

* * * * *